(12) United States Patent
Yang et al.

(10) Patent No.: US 7,910,919 B2
(45) Date of Patent: Mar. 22, 2011

(54) ORGANIC LIGHT EMITTING DISPLAY AND FABRICATING METHOD THEREOF

(75) Inventors: Taehoon Yang, Yongin-si (KR); Jinwook Seo, Yongin-si (KR); Byoungkeon Park, Yongin-si (KR); Kiyong Lee, Yongin-si (KR); Seihwan Jung, Yongin-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 553 days.

(21) Appl. No.: 11/961,213

(22) Filed: Dec. 20, 2007

(65) Prior Publication Data
US 2008/0157099 A1 Jul. 3, 2008

(30) Foreign Application Priority Data

Dec. 29, 2006 (KR) .................. 10-2006-0138321

(51) Int. Cl.
*H01L 35/24* (2006.01)
*H01L 51/00* (2006.01)
(52) U.S. Cl. .................. 257/40; 257/59; 257/72; 349/5; 349/42; 349/43; 349/94; 313/498; 313/499; 313/500; 313/505
(58) Field of Classification Search .............. 257/40, 257/59, 72; 349/5, 42, 43, 94; 313/498, 313/499, 500, 505
See application file for complete search history.

(56) References Cited

U.S. PATENT DOCUMENTS

| | | | |
|---|---|---|---|
| 5,710,050 A | 1/1998 | Makita et al. | |
| 5,821,562 A | 10/1998 | Makita et al. | |
| 6,204,895 B1 * | 3/2001 | Nakamura et al. | 349/5 |
| 7,391,055 B1 * | 6/2008 | Murakami et al. | 257/72 |
| 2001/0040645 A1 * | 11/2001 | Yamazaki | 349/42 |
| 2004/0222187 A1 | 11/2004 | Lin | |
| 2005/0161742 A1 * | 7/2005 | Isobe et al. | 257/347 |
| 2005/0230684 A1 | 10/2005 | Seo et al. | |

FOREIGN PATENT DOCUMENTS

| | | |
|---|---|---|
| JP | 11-168220 | 6/1999 |
| JP | 2003-332349 | 11/2003 |

(Continued)

OTHER PUBLICATIONS

U.S. Appl. No. 11/961,213, filed Dec. 20, 2007, Taehoon Yang et al.

(Continued)

*Primary Examiner* — Kenneth A Parker
*Assistant Examiner* — Anthony Ho
(74) *Attorney, Agent, or Firm* — Stein McEwen, LLP

(57) ABSTRACT

An organic light emitting display and a fabricating method thereof in which an alignment mark is formed in the non-display region. The organic light emitting display includes a substrate having a display region and a non-display region; a buffer layer formed the overall substrate; a gate insulating layer; a gate electrode formed on the gate insulating layer corresponding to the active layer; an interlayer dielectric layer formed on the gate insulating layer; a source/drain electrode formed on the interlayer dielectric layer and electrically coupled to the active layer; an insulating layer formed on the source/drain electrode; and an organic light emitting diode formed on the insulating layer and electrically coupled to the source/drain electrode. Further, the organic light emitting display includes an alignment mark formed on one of the substrate and the buffer layer.

34 Claims, 8 Drawing Sheets

FOREIGN PATENT DOCUMENTS

| | | |
|---|---|---|
| JP | 2005-326815 | 11/2005 |
| JP | 2006-19689 | 1/2006 |
| JP | 2006-54223 | 2/2006 |
| JP | 2006-332314 | 12/2006 |
| KR | 2001-0015479 | 2/2001 |
| KR | 10-2006-0001711 | 1/2006 |
| KR | 10-2006-0050318 | 5/2006 |
| KR | 10-607665 | 7/2006 |
| KR | 2006-86807 | 8/2006 |

OTHER PUBLICATIONS

US Office Action issued Dec. 24, 2008, in corresponding U.S. Appl. No. 11/961,187.

US Office Action issued Jul. 24, 2009, in corresponding U.S. Appl. No. 11/961,187.

* cited by examiner

ORGANIC LIGHT EMITTING DISPLAY AND FABRICATING METHOD THEREOF

CROSS-REFERENCE TO RELATED APPLICATIONS

This application claims the benefit of Korean Patent Application No. 2006-138321, filed Dec. 29, 2006, in the Korean Intellectual Property Office, the disclosure of which is incorporated herein by reference.

BACKGROUND OF THE INVENTION

1. Field of the Invention

Aspects of the present invention relate to an organic light emitting display and a fabricating method thereof, and more particularly, to an organic light emitting display and a fabricating method thereof capable of precisely controlling the position of crystallization of an amorphous silicon and forming an active layer (thin film transistor) by forming an alignment mark on a region of a substrate.

2. Description of the Related Art

Generally, an organic light emitting diode is an apparatus in which an electron and a hole are bound in a fluorescent and/or phosphorescent organic compound to thereby emit light by injecting the hole from an anode and injecting the electron from a cathode into a light emitting layer.

As shown in FIG. 1, an organic light emitting diode is comprises an anode electrode (ITO), which may be formed of Indium Tin Oxide, an organic thin film, and a cathode electrode (Metal). The organic thin film may comprise an emission layer (EML) to emit light by forming excitons as the electron and hole (+) bind to each other, an electron transport layer (ETL) to transport the electron, and a hole transport layer (HTL) to transport the hole (+). Also, an electron injecting layer (EIL) may be formed on one side of the electron transport layer (ETL), and a hole injecting layer (HIL) may further be formed on one side of the hole transport layer (HTL).

A passive matrix driving method and an active matrix driving method may be used to drive the organic light emitting diode. The passive matrix driving method has advantages that the manufacturing process is simple and the investment cost is low. The passive matrix driving method uses an anode and a cathode that cross in an orthogonal direction from which lines are selected and driven; however the passive matrix driving method is disadvantageous in that the current consumption is too high when used to drive a large size display. The active matrix driving method has advantages in that the current consumption is low, the display quality and life of the display is good, and the active matrix driving method may be applied to a medium to large size display by forming an active element and a storage capacitor at each pixel.

The fabricating method of the organic light emitting display includes an operation of crystallizing the amorphous silicon, an operation of fabricating the active layer (thin film transistor), and an operation of fabricating the organic light emitting diode. There is an encapsulation operation, a module assembly operation, and the like; however, the explanation of such operations will be omitted.

The operation of crystallizing the amorphous silicon comprises a substrate cleaning operation, a buffer layer forming operation, an amorphous silicon vapor depositing operation, a polysilicon forming operation, and the like.

The operation of fabricating the active layer comprises an operation of patterning the polysilicon, a gate insulating layer forming operation, a gate patterning operation, an ion injecting/activating operation, an interlayer dielectric layer forming operation, a contact forming operation, source/drain patterning operation, and the like. An insulating layer and via forming operation, an ITO forming operation, and a pixel definition layer forming operation are further executed.

The organic light emitting diode fabricating operation comprises a cleaning operation, a pretreatment operation, an organic light emitting diode vapor depositing operation, a cathode vapor depositing operation, and the like.

The forming positions of the amorphous silicon crystallizing operation and the active layer (thin film transistor) fabricating operation are precisely controlled so that a characteristic dispersion of the diode becomes minimal. For example, in the amorphous silicon crystallizing operation, it is preferable that the forming size and direction, etc. of the polysilicon are precisely controlled so that a grain boundary of the polysilicon has a maximum size and uniform directional property. In the active layer (thin film transistor) fabricating operation, it is preferable that the source/drain/gate are controlled and formed (patterned) so that they are positioned in the region and direction having an optimal grain boundary. Further, even in the gate electrode forming operation, it is preferable to form the gate electrode with respect to the size and direction of the polysilicon as described above.

However, the crystallization technology in consideration of position and direction during the crystallization process, which is converting the amorphous silicon to the polysilicon, and the technology in consideration of the position and direction during the active layer forming process are not well developed. The organic light emitting display, unlike a liquid crystal display, generally forms the active layer (thin film transistor) after the amorphous silicon is crystallized to form the polysilicon; however, any technology optimizing the position of the polysilicon and active layer (thin film transistor) is not well developed.

Therefore, the properties of the manufactured thin film transistor, such as threshold voltage, S-factor, off current, and mobility, are not uniform among the formed thin film transistors, and thus there is a problem that the luminance of the organic light emitting diode driven by the controlled current is also not uniform due to the lack of precision in forming the polysilicon and the active layer (thin film transistor).

SUMMARY OF THE INVENTION

Aspects of the present invention overcome the above-described and/or other problems, and an aspect of the present invention is to provide an organic light emitting display and a fabricating method thereof capable of controlling the position of crystallization of an amorphous silicon precisely and forming an active layer (thin film transistor) by forming an alignment mark on a certain region of a substrate.

An organic light emitting display according to aspects of the present invention includes a substrate having a display region and a non-display region; a buffer layer formed on the display region and the non-display region in which a catalytic metal is present; an alignment mark formed on one of the buffer layer and the substrate in the non-display region of the substrate; an active layer formed on the buffer layer by an SGS crystallization method corresponding to the display region of the substrate; a gate insulating layer formed on the alignment mark and the active layer; a gate electrode formed on the gate insulating layer corresponding to the active layer; an interlayer dielectric layer formed on the gate insulating layer; a source/drain electrode formed on the interlayer dielectric layer and electrically coupled to the active layer; an insulating layer formed on the source/drain electrode; and an organic light emitting diode formed on the insulating layer and electrically coupled to the source/drain electrode.

The volume density of the catalytic metal present in the buffer layer may be less than $2.0 \times 10^{18}$ atoms/cm$^3$. The catalytic metal may also remain in the alignment mark and the active layer. The volume density of the catalytic metal, which remains in the alignment mark and the active layer, may be 21.0E16 to 1.0E20 atoms/cm$^3$. The catalytic metal is selected from the group comprising Ni, Pd, Ti, Ag, Au, Al, Sn, Sb, Cu, Co, Mo, Tr, Ru, Rh, Cd, Pt, or combinations thereof.

The active layer is the polysilicon formed by the SGS crystallization method, and no grain boundary or at least one grain boundary may be in the polysilicon.

The alignment mark may be formed on the buffer layer. The alignment mark may be formed underneath the buffer layer. The alignment mark may be made of any one selected from the group consisting of a conductor, an insulator, an amorphous silicon, a microsilicon and a polysilicon. The thickness of the alignment mark may be 100 to 1000 Å. The shape of the alignment mark may be any one selected from a triangle shape, a square shape, a rhombus shape, a pentagon shape, a cross shape, and combinations thereof. The cross-sectional area of the alignment mark may be 100 to 900 µm$^2$. The width of the alignment mark may be 1 to 20 µm.

The thin film transistor comprises the active layer, the gate insulating layer, the gate electrode, the interlayer dielectric layer and the source/drain, and the average of S-factor of the thin film transistor may be 0.44V/dev and the standard deviation may be 0.01V/dev.

The thin film transistor comprises the active layer, the gate insulating layer, the gate electrode, the interlayer dielectric layer and the source/drain, and the average of the off current of the thin film transistor may be 1.20E-12 A/µm, and the standard deviation may be 4.10E-13 A/µm.

The display region may be formed at the center of the substrate, and the non-display region may be formed about the periphery of the display region. The substrate may be any one selected from a glass, a plastic, a stainless steel, and a nano complex composition.

The interlayer dielectric layer may further be formed on the gate insulating layer corresponding to the alignment mark. The insulating layer may further be formed on the interlayer dielectric layer corresponding to the alignment mark. The insulating layer may be consisted of a protective layer and a planarization layer, and it may be formed on the region corresponding to the alignment mark.

A fabricating method of the organic light emitting display according to aspects of the present invention includes an operation of preparing a substrate which is provided with a non-display region formed about a periphery of the display region; an operation of forming a buffer layer on the display and non-display regions; an operation of forming an alignment mark on the non-display region; an operation of depositing an amorphous silicon on the buffer layer; an operation of forming a capping layer on the amorphous silicon; an operation of converting the amorphous silicon to a polysilicon by diffusing the catalytic metal throughout the amorphous silicon and performing heat treatment; an operation of forming an active layer by using the polysilicon; and an operation of forming an organic light emitting diode that electrically coupled to the active layer.

The operation of forming the capping layer includes an operation of forming a diffusion preventing layer having at least one opening for position control at a position spaced apart from the alignment mark, and an operation of forming a diffusion layer that covers the opening for position control and the diffusion preventing layer.

The operation of forming the active layer may form the active layer at a position spaced apart from the alignment mark.

The catalytic metal used in the polysilicon forming operation may be selected from the group comprising Ni, Pd, Ti, Ag, Au, Al, Sn, Sb, Cu, Co, Mo, Tr, Ru, Rh, Cd, Pt, and combinations thereof. The catalytic metal used in the polysilicon forming operation may remain in the buffer layer. The volume density of the catalytic metal that remains in the buffer layer may be $2.0 \times 10^{18}$ atoms/cm$^3$ and below. The catalytic metal used in the polysilicon forming operation may remain in any one of the alignment mark and the buffer layer. The volume density of the catalytic metal that remains in the alignment mark and the active layer may be $1.0 \times 10^{16}$ to $10 \times 10^{20}$ atoms$^3$.

The heat treatment temperature applied to the polysilicon forming operation may be 400 to 700° C.

After the operation of forming the active layer, an operation of removing the amorphous silicon except for the active layer may further be included.

The alignment mark forming operation may form the alignment mark on the buffer layer. The alignment mark forming operation may form the alignment mark underneath the buffer layer. In the alignment mark forming operation, the alignment mark may be made of any one selected from the group consisting of a conductor, an insulator, an amorphous silicon, a microsilicon and a polysilicon. In the alignment mark forming operation, the thickness of the alignment mark may be 100 to 1000 Å. In the alignment mark forming operation, the plane shape of the alignment mark may be a triangle shape, a square shape, a rhombus shape, a pentagon shape and a cross shape. In the alignment mark forming operation, the cross-sectional area of the alignment mark may be 100 to 900 µm$^2$. In the alignment mark forming operation, the width of the alignment mark may be 1 to 20 µm.

Therefore, an organic light emitting display and a fabricating method thereof may form the polysilicon and the active layer (thin film transistor) at an optimal position by using the alignment mark, as the alignment mark is formed on the non-display region of the substrate.

That is, the characteristic dispersion between the diodes may be considerably improved, by forming the polysilicon having the grain boundary of optimal size, direction, and position by use of the alignment mark, and by forming the active layer (thin film transistor) of optimal position by use of the polysilicon.

For example, the thin film transistor formed by the aforementioned method may have the average S-factor of 0.44V/dev with a standard deviation of 0.01V/dev. Also, the thin film transistor may have the average off current of 1.20E-12 A/µm with a standard deviation of 4.10E-13 A/µm.

The organic light emitting diodes, which are electrically coupled to the thin film transistor formed by the aforementioned method, have the uniform luminance, even if the size of the panel is enlarged.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
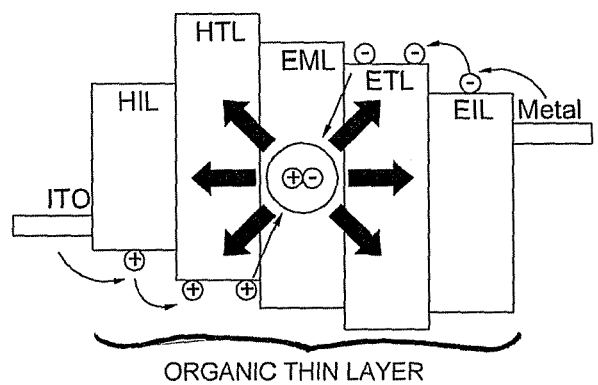
FIG. 1 is a schematic view illustrating the structure of a conventional organic light emitting diode.

Reference will now be made in detail to the present embodiments or aspects of the present invention, examples of which are illustrated in the accompanying drawings, wherein like reference numerals refer to the like elements throughout. The embodiments are described below in order to explain the present invention by referring to the figures. Hereinafter, aspects of the present invention will be described more specifically with reference to the accompanying drawings, so that a person ordinarily skilled in the art will understand the different aspects of the present invention without difficulties from the explanation, as follows.

Figure 2:
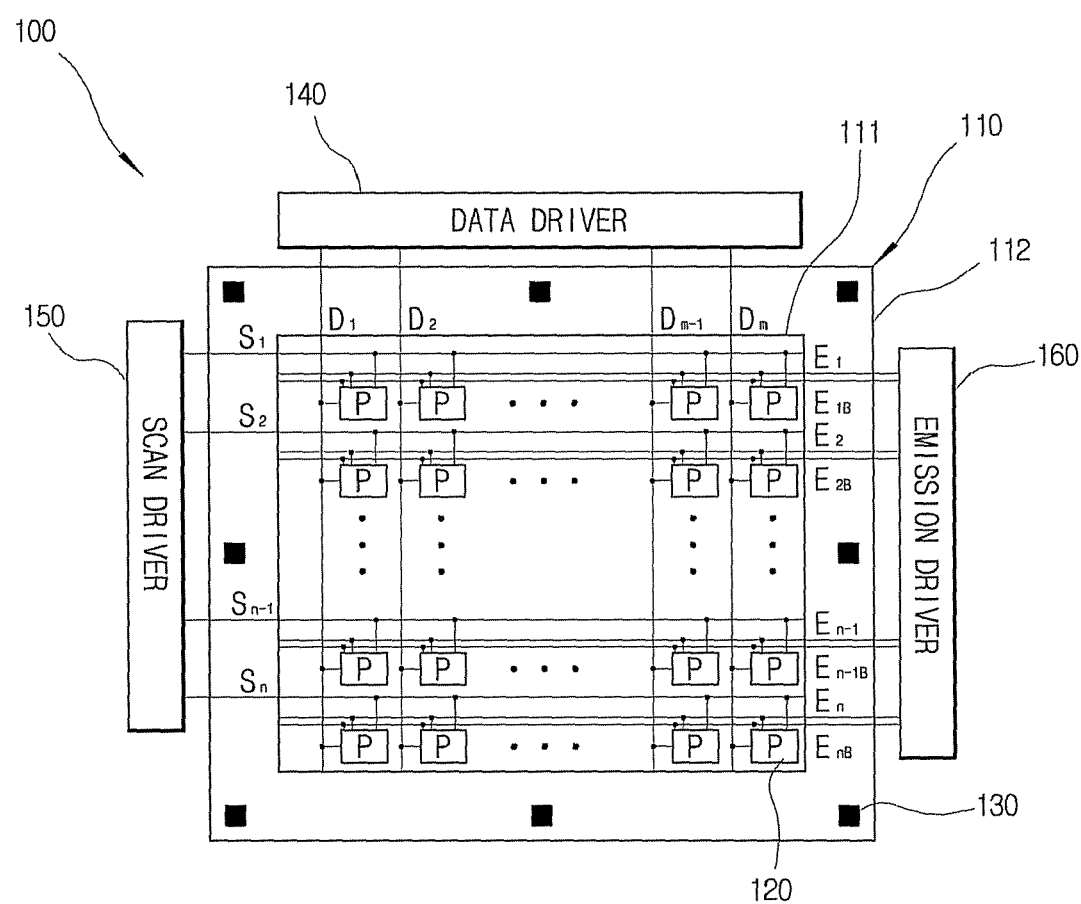
FIG. 2 is a schematic view illustrating an organic light emitting display according to aspects of the present invention.
Figure 3A:
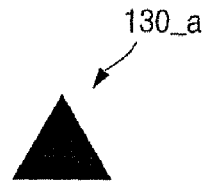
FIGS. 3a to 3f are enlarged views illustrating various shapes of the alignment mark of FIG. 2.
Figure 3B:
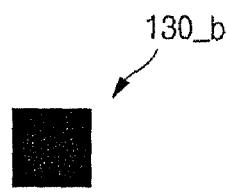
Figure 3C:
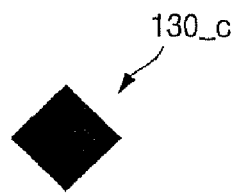
Figure 3D:
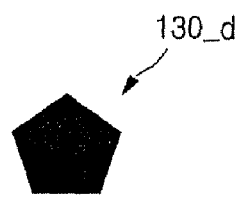
Figure 3E:
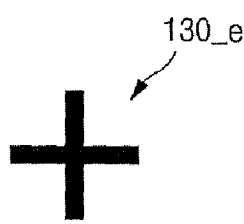
Figure 3F:
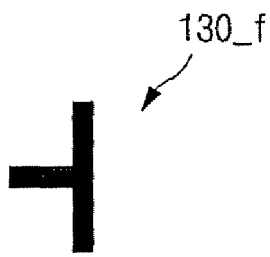

Referring FIG. 2, an organic light emitting display having an alignment mark according to aspects of the present invention is shown as a schematic view. As shown in FIG. 2, the organic light emitting display (OLED) 100 according to aspects of the present invention includes a substrate 110 having a display region 111 and a non-display region 112; at least one pixel region 120 formed on the display region 111 of the substrate 110; and at least one alignment mark 130 formed on the non-display region 112 of the substrate 110. Here, the pixel region 120 and the alignment mark 130 are small with respect to the substrate 110; however, they are enlarged for the understanding of different aspects of the present invention. A data driver 140, a scan driver 150, and an emission driver 160 may further be coupled to the substrate 110.

The substrate 110 may be formed into the display region 111 in a rectangular shape, and the non-display region 112 in a hollow-rectangular band shape surrounding the display region 111. However, the substrate 110 is not limited thereto such that the display region 111 and the non-display region 112 may be formed differently. For example, the display region 111 may comprise square regions between which the non-display region 112 extends. Or, the display region 111 and the non-display region 112 may be formed in another shape, such as triangles. In the display region 111, a plurality of data lines (D1 to Dm) may be formed in a first direction, and a plurality of scan lines (S1 to Sn) and emission control lines (E1 to En) may be formed in a second direction. The first direction may be vertical with respect to an image to be displayed, and the second direction may be disposed to cross the first direction or be horizontal with respect to the image to be displayed; however, the first and second directions are not limited thereto. The emission control lines (E1 to En) as well as light-emission bar control lines (E1B to EnB) may further be formed in the display region 111.

The pixel region 120 may be formed in the intersection region of the data lines (D1 to Dm), the scan lines (S1 to Sn), and the emission control lines (E1 to En) in the display region 111 of the substrate 110. The pixel region 120 may be formed by a transistor, a storage capacitor, and an organic light emitting diode. The pixel region 120 will be described in greater detail below.

At least one alignment mark 130 may be formed in the non-display region 112 of the substrate 110. The alignment mark 130 is used to control the position of the formation of the amorphous silicon during the crystallization process thereof, and the alignment mark 130 is used to control the position of the formation of the active layer (thin film transistor) at an optimal location. The alignment mark 130 may also be used to control the position of the formation of the gate electrode, the data lines, the scan lines, the emission control lines, and the organic light emitting diodes when each are formed. And, the alignment mark 130 may be formed with any one selected from the group consisting of a conductor, an insulator, an amorphous silicon, a microsilicon and a polysilicon; however, the material from which the alignment mark 130 is formed is not limited thereto. The alignment mark 130 may be formed up, down, left and right symmetrical shape or asymmetrical shape, and the number of it may be 1 to 20. However, the position and number of the alignment mark 130 is not limited thereto.

The data driver 140 provides data signals to the pixel region 120 of the display region 111 on the substrate 110 via a plurality of the data lines (D1, . . . , Dm). The scan driver 150 provides scan signals to the pixel region 120 of the display region 111 on the substrate 110 via a plurality of the scan lines (S1, . . . , Sn) in sequence. The emission driver 160 provides emission control signals to the pixel region 120 of the display region 111 of the substrate 110 via a plurality of the emission control lines (E1, . . . , En).

The data driver 140, the scan driver 150, and the emission driver 160 may be formed on the substrate 110. For example, the data, scan, and emission drivers 140, 150, and 160 may be formed on the non-display region 112 on the substrate 110 as an integrated circuit or as individual integrated circuits. Furthermore, the data, scan, and emission drivers 140, 150, and 160 may be formed on an identical layer, on which the transistors of the data lines (D1, . . . , Dm), the scan lines (S1, . . . , Sn), the emission control lines (E1, . . . , En), and the pixel region 120 are formed. The data, scan, and emission drivers 140, 150, and 160 may be formed on a separate layer, and the separate layer may be coupled to the substrate 110. Moreover, the data, scan, and emission drivers 140, 150, and 160 may be configured in the form of any one selected from a TCP (Tape Carrier Package), an FPC (Flexible Printed Circuit), a TAB (Tape Automatic Bonding), a COG (Chip On Glass), and equivalents thereof, and the shapes and the positions of the drivers according to aspects of the present invention are not limited.

Referring to FIGS. 3a to 3f, a plurality of shapes of the alignment mark 130 of FIG. 2 are illustrated. As shown in FIGS. 3a to 3f, the alignment mark 130 may have a shape of any one selected from triangle shape (130_a) (FIG. 3a), a square shape (130_b) (FIG. 3b), a rhombus shape (130_c) (FIG. 3c), a pentagon shape (130_d) (FIG. 3d), a cross shape (130_e) (FIG. 3e), a "+" or "T" shape (130_f) (FIG. 3f, and equivalents thereof, or the combination thereof. However, the form or shape of the alignment mark 130 is not limited thereto, and numerous forms or shapes are also possible.

It is preferable that the cross-sectional area of the alignment mark 130 is formed to be 100 to 900 μm². That is, if the cross-sectional area of the alignment mark 130 is 100 μm² or below then it is difficult to see the alignment mark 130 under a microscope, and if the cross-sectional area of the alignment mark 130 is 900 μm² or above then it is difficult for the alignment mark 130 to be used to control the position during the crystallization process or the active layer forming process. As used herein, cross-sectional area of the alignment mark 130 refers the area of the alignment mark 130 with reference to a plane as defined by the substrate 110 or the buffer 120.

Further, since the shape of the alignment mark 130 can be one of various shapes, it is preferable that the width of the alignment mark 130 is 20 μm or below. That is, when the width of the alignment mark 130 is 20 μm or above, the tolerance for defining the position of the alignment mark 130 is too great so that the features of the alignment mark 130 are lost. The range of 1 to 20 μm is sufficient when it can be seen through the microscope.

Figure 4:
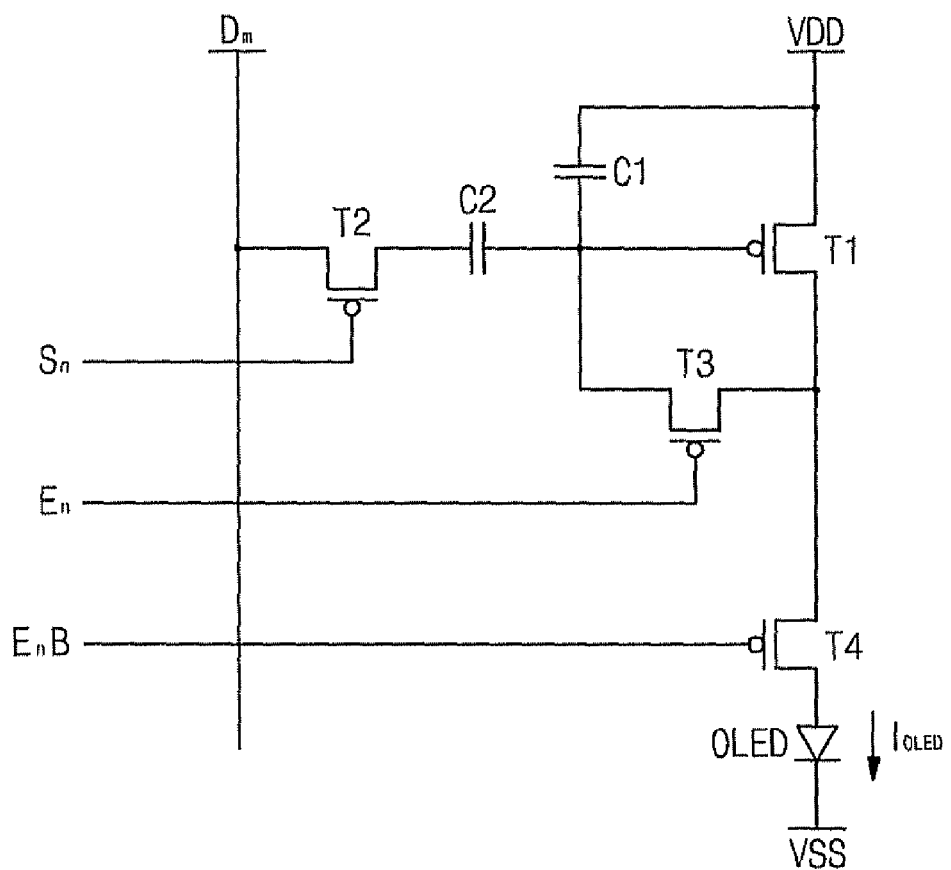
FIG. 4 is a circuit diagram illustrating a pixel circuit from organic light emitting displays.

Referring to FIG. 4, the pixel circuit formed in a pixel region in the display region of the organic light emitting display is illustrated according to aspects of the present invention. As shown in FIG. 4, the pixel circuit comprises a data line (Dm) to provide a data signal; a scan line (Sn) to provide a scan signal; a first power voltage line (VDD) to provide a first power voltage; a second power voltage line (VSS) to provide a second power voltage; a light-emission control line (En) to provide an emission control signal; a light-emission bar control line (EnB) to provide a light-emission bar control signal; first to fourth transistors (T1, T2, T3, T4), a first and a second storage capacitor (C1, C2), and an organic light emitting diode (OLED). Here, the voltage of the first power voltage line (VDD) is relatively higher than that of the second power voltage line (VSS). Here, the emission control signal is also referred to as an auto zero signal, and the light-emission bar control signal is also referred to as an auto zero bar signal.

In the pixel circuit as shown in FIG. 4, when the emission control signal of a low level is provided from the light emission control line (En) to the control electrode of the third transistor (T3), then the third transistor (T3) is turned on. And, when the light-emission bar control signal of a high level is provided from the light-emission bar control line (EnB) to the control electrode of the fourth transistor (T4), then the fourth transistor (T4) is turned off. And then, a threshold voltage of the first transistor (T1) is stored in the first storage capacitor (C1) as the first transistor (T1) is connected in the form of a diode. In other words, if the light-emission control signal is applied at a high level to the control electrode for the third transistor (T3), a data voltage corresponding to a gray level is applied from the data line (Dm), and the scan signal applied at a low voltage to the control electrode of the second transistor (T2), then the data voltage, is applied to the control electrode of the first transistor (T1). The data voltage applied to the control electrode of the first transistor (T1) is compensated by the coupling ratio of the first storage capacitor (C1) and the second storage capacitor (C2). And, if the light-emission bar control signal is turned to the low level (i.e., a low level voltage is applied to the control electrode of the fourth transistor (T4), then the current from the first power voltage line (VDD) flows into the organic light emitting diode (OLED) through the first transistor (T1) which controls the current according to the data voltage, and thus the light is emitted.

Figure 5A:
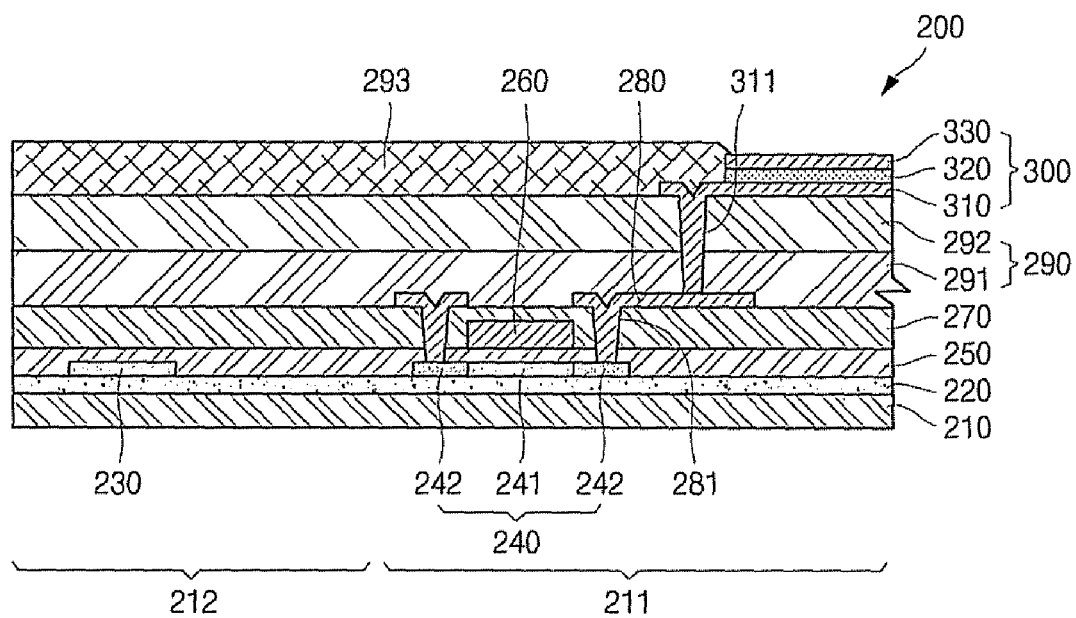
FIGS. 5a and 5b are cross-sectional views illustrating the relation between the alignment mark and the pixel circuit.
Figure 5B:
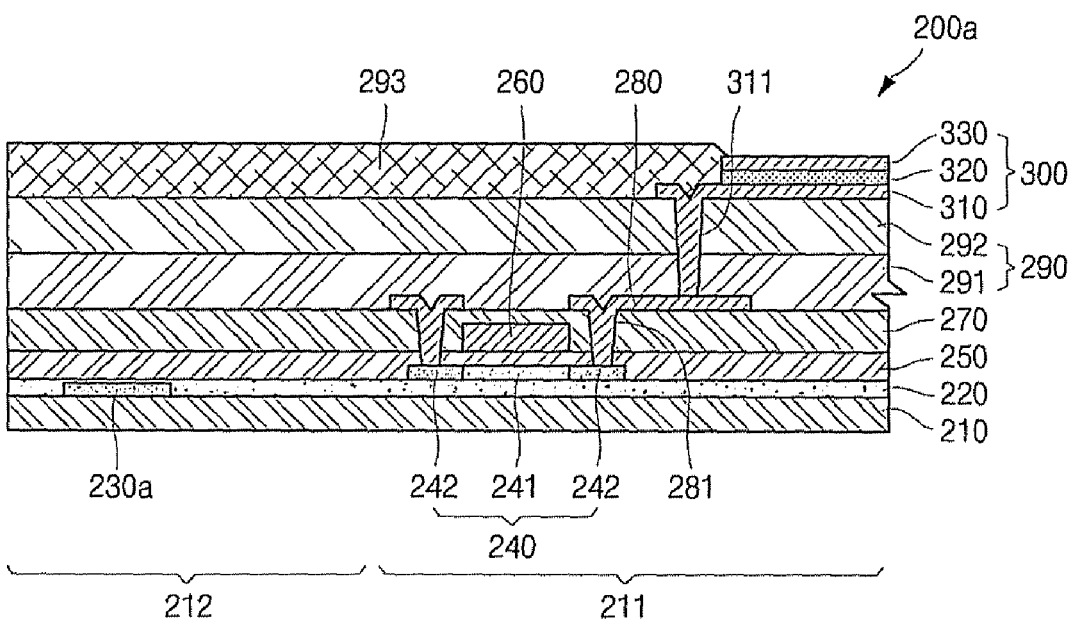

FIGS. 5a and 5b are cross-sectional views of the organic light emitting display illustrating the relation between the alignment mark and the pixel circuit. As shown in FIG. 5a, the organic light emitting display 200 includes a substrate 210, a buffer layer 220, an alignment mark 230, an active layer 240, a gate insulating layer 250, a gate electrode 260, an interlayer dielectric layer 270, a source/drain electrode 280, an insulating layer 290, and an organic light emitting diode 300.

The substrate 210 is generally flat and has flat upper and lower surfaces. The thickness of the substrate 210 between the upper and lower surfaces is approximately 0.05 to 1 mm. When the thickness of the substrate 210 is 0.05 mm and below, the substrate 210 is vulnerable to the damage from cleaning, etching, and heat treatment processes and from external force. If the thickness of the substrate 210 is 1 mm and above, such thickness increases a thickness of the display device. Further, the substrate 210 may be any one selected from a glass, a plastic, a stainless steel, a nanocomplex composition and equivalents thereof; however, the substrate 210 is not limited thereto. The substrate 210 is classified into the display region 211 and the non-display region 212. As described above, the pixel region including the active layer 240 and/or the organic light emitting diode 300 is formed in the display region 211 of the substrate 210, and the alignment mark 230 and the various drivers (140, 150, 160) may formed in the non-display region 212.

The buffer layer 220, disposed on the upper layer of the substrate 210, may be formed in the display region 211 and the non-display region 212. The buffer layer 220 prevents $H_2O$, $H_2$, $O_2$, and the like from penetrating through the substrate and affecting the alignment mark 230 and the active layer 240. The buffer layer 220 may be formed of at least any one selected from the group consisting of silicon oxide film ($SiO_2$), silicon nitride film ($Si_3N_4$), inorganic film, and equivalents thereof; however, the buffer layer 220 is not limited thereto. The buffer layer 220 may be omitted.

Here, the catalytic metal from the crystallization process may remain in the buffer layer 220. The catalytic metal may be selected from the group comprising of Ni, Pd, Ti, Ag, Au, Al, Sn, Sb, Cu, Co, Mo, Tr, Ru, Rh, Cd, Pt, and equivalents and combinations thereof; however, the catalytic metal is not limited thereto. For example, the catalytic metal may be any metal that promotes or catalyzes the crystallization of the amorphous silicon. The catalytic metal, as described below, is formed during the process that crystallizes the amorphous silicon into the polysilicon. It is preferable that the volume density of the catalytic metal is controlled to be $2.0 \times 10^{18}$ atoms/cm³ and below. That is, when the volume density of the catalytic metal is $2.0 \times 10^{18}$ atoms/cm³ and above, a leakage current may flow. The electrical characteristics of the OLED 200 are improved as the volume density of the catalytic metal is reduced.

The alignment mark 230 may be formed on the upper surface of the buffer layer 220 in the non-display region 212 of the substrate 210. The alignment mark 230 may be any one selected from the group consisting of a conductor, an insulator, an amorphous silicon, a microsilicon, a polysilicon, and equivalents thereof; however alignment mark 230 is not limited thereto. It is preferable that the thickness of the alignment mark 230 is 100 to 1000 Å. When the thickness of the alignment mark 230 is less than about 100 Å, then the alignment mark 230 is too transparent to be functional with current technology. And, when the thickness of the alignment mark 230 is greater than about 1000 Å, then the alignment mark 230 may be unnecessarily thick. Even though the alignment mark 230 is shown as formed on the buffer layer 220 as in FIG. 5a, it is possible to form the alignment mark 230 on the substrate 210 below the buffer layer 220. That is, as shown in FIG. 5b, it is possible to form the alignment mark 230a on the upper surface of the substrate 210 and to form the buffer layer 220 to cover the alignment mark 230a. In addition, the alignment mark 230 may be formed on the buffer layer 220 while an alignment mark 230a is formed on the substrate 210. Further, the alignment mark 230a may be formed on the surface of the substrate 210 by a laser or a chemical etching. According to aspects of the present invention, the alignment mark 230, 230a may be formed before the crystallization process.

The plane shape of the alignment mark 230, 230a may be a shape selected from a triangle shape, a square shape, a rhombus shape, a pentagon shape, a cross shape, a "-" shape, and equivalents thereof, or a combination of such shapes. However, the plane shape of the alignment mark 230, 230a is not limited thereto (see FIGS. 3a to 3f).

It is preferable that the cross-sectional area of the alignment mark 230, 230a is formed to be 100 to 900 μm$^2$. That is, if the cross-sectional area of the alignment mark 230, 230a is less than about 100 μm$^2$ then the alignment mark 230, 230a is difficult to see the alignment mark 230, 230a under a microscope. If the cross-sectional area of the alignment mark 230, 230a is 900 μm$^2$ or above, the alignment mark 230, 230a becomes difficult to use it as an alignment mark 230, 230a. As used herein, cross-sectional area of the alignment mark 230, 230a refers the area of the alignment mark 230, 230a with reference to a plane as defined by the substrate 210 or the buffer 220.

As the shape of the alignment mark 230, 230a can be any various shape, it is preferable that the width of the alignment mark 230, 230a is approximately less than 20 μm. That is, when the width of the alignment mark 230, 230a is greater than approximately 20 μm, the tolerances associated with defining the position of the alignment mark 230, 230a are too great such that the features of the alignment mark 230, 230a are lost. The range of 1 to 20 μm is sufficient when the alignment mark 230, 230a can be seen through the microscope.

The catalytic metal may remain in the alignment mark 230, 230a. In particular, the catalytic metal may remain in the alignment mark 230, 230a when the alignment mark 230, 230a is an insulator, an amorphous silicon, a microsilicon, and an organic material.

As described above, the catalytic metal may be selected from the group comprising Ni, Pd, Ti, Ag, Au, Al, Sn, Sb, Cu, Co, Mo, Tr, Ru, Rh, Cd, Pt and equivalents and combinations thereof; however, the catalytic metal is not limited thereto. As described below, the catalytic metal is formed during the crystallization process of converting the amorphous silicon into the polysilicon.

Continuing with reference to both FIGS. 5a and 5b, the active layer 240 may be formed on the upper surface of the buffer layer 220 in the display region 211 of the substrate 210. The active layer 240 is spaced apart from the alignment mark 230, 230a by a predetermined distance. Also, the active layer 240 is formed at a predetermined distance and at a predetermined direction from the alignment mark 230, 230a so as to increase the precision with which the active layer 240, and other layers, may be formed. The active layer 240 includes a channel region 241, and a source/drain region 242 formed at both sides of the channel region 241. The active layer 240 may be any one selected from the group consisting of amorphous silicon, microsilicon (wherein a grain size of the microsilicon is between that of the amorphous silicon and that of the polysilicon), polysilicon, organic material, and equivalents thereof; however, the active layer 240 is not limited thereto. The active layer 240 may be used as a thin film transistor. The active layer 240 (that is, thin film transistor) is defined as a coplanar structure. However, the active layer 240 is not limited to the coplanar structure, but the active layer 240 may have any kind of structure of the thin film transistor, for example at least one of selected from the group comprising an inverted coplanar structure, a staggered structure, an inverted staggered structure, and equivalents thereof; however, the structure of the active layer 240 is not limited thereto.

When the thin film transistor is a polysilicon thin film transistor, the polysilicon thin film transistor may be formed by any one selected from a crystallization method using a laser at low temperature, a crystallization method using a metal, a crystallization method using a metal and capping layer (SGS crystallization method), and equivalents thereof; however, the crystallization method is not limited thereto. The crystallization method using the laser may be ELA (Excimer Laser Annealing), SLS (Sequential Lateral Solidification), TDX (Thin Beam Direction Crystallization), and the like; however, the crystallization method is not limited thereto. The crystallization method using the metal may be SPC (Solid Phases Crystallization), MIC (Metal Induced Crystallization), MILC (Metal Induced Lateral Crystallization), and the like; however, the crystallization method is not limited thereto. The crystallization method using the metal and capping layer is SGS (Super Grained Silicon), and the like; however, the crystallization method is not limited thereto. The thin film transistor may be at least any one selected from PMOS, NMOS, and equivalents; however, the conductive form of the thin film transistor is not limited thereto.

The catalytic metal may remain in the active layer 240. In particular, the catalytic metal may remain in the active layer 240 when the active layer 240 is the amorphous silicon, microsilicon, polysilicon, and organic material.

The catalytic metal may be selected from the group comprising Ni, Pd, Ti, Ag, Au, Al, Sn, Sb, Cu, Co, Mo, Tr, Ru, Rh, Cd, Pt, and equivalents and combinations thereof; however, the material of the catalytic metal is not limited thereto. As described below, the catalytic metal is formed during the crystallization process converting the amorphous silicon to the polysilicon.

The catalytic metals which remain in the alignment mark 230, 230a and the active layer 240 may have the volume density similar to each other. Particularly, when the alignment mark 230, 230a is formed on the buffer layer, the density of the catalytic metal which remains in the alignment mark 230, 230a and the active layer 240 are almost identical. Indeed, when the alignment mark 230, 230a is formed on the buffer layer, the volume density of the catalytic metal which remains in the alignment mark 230, 230a and the active layer 240 is approximately $1.0 \times 10^{16}$ to $1.0 \times 10^{20}$ atoms/cm$^3$. When the volume density of the catalytic metal is greater than $1.0 \times 10^{20}$ atoms/cm$^3$, a leakage current may be generated, and thus it is not preferable.

Here, the SGS crystallization method is a crystallization method which converts the amorphous silicon to the polysilicon with relatively large grain size through heat-treatment after the capping layer and the catalytic metal are formed on the amorphous silicon. If the active layer 240 is formed by the SGS crystallization method, then no grain boundary or at least one grain boundary is formed therein. When the alignment mark 230, 230a is formed as a polysilicon, no grain boundary or at least one grain boundary is also formed on the alignment mark 230, 230a.

The gate insulating layer 250 may be formed on the upper surface of the alignment mark 230, 230a and the active layer 240. The gate insulating layer 250 may be formed on the buffer layer 220, which may circumscribe the alignment mark 230, 230a and the active layer 240. The gate insulating layer 250 may be formed of at least any one selected from the group consisting of a silicon oxide film, a silicon nitride film, an inorganic film, and equivalents thereof; however, the gate insulating layer 250 is not limited thereto.

The gate electrode 260 may be formed on the upper surface of the gate insulating layer 250. More specifically, the gate electrode 260 may be formed on the gate insulating layer 250 in area corresponding to the channel region 241 of the active layer 240. The gate electrode 260 forms the channel of the hole or electron in the channel region 241 by applying an electric field to the lower channel region 241 of the gate insulating layer 250. The gate electrode 260 may be made of a material selected from a typical metal (Mo, MoW, Ti, Cu, Al, AlNd, Cr, Mo alloy, Cu alloy, Al alloy, etc.), a doped polysilicon, and equivalents thereof; however, the gate electrode 260 is not limited thereto.

The interlayer dielectric layer 270 may be formed on the upper surface of the gate electrode 260. The interlayer dielectric layer 270 may be formed on the gate insulating layer 250 which may circumscribe the gate electrode 260. Further, the interlayer dielectric layer 270 may be formed on the gate insulating layer 250 corresponding to the alignment mark 230, 230*a*. The interlayer dielectric layer 270 may be formed of any one selected from the group consisting of polymer series, plastic series, glass series, and equivalents thereof; however, the material of the interlayer dielectric layer 270 is not limited thereto.

The source/drain electrode 280 may be formed on the upper surface of the interlayer dielectric layer 270. An electrically conductive contact 281 passing through the interlayer dielectric layer 270 may be formed to connect the source/drain electrode 280 and the active layer 240. That is, the source/drain region 242 and the source/drain electrode 280 of the active layer 240 are electrically coupled to each other by the electrically conductive contact 281. Further, the source/drain electrode 280 may be formed of the identical metal material as the gate electrode 260; however, the source/drain electrode 280 is not limited thereto. The above active layer 240 (i.e., thin film transistor) is defined as a coplanar structure. However, the active layer 240 is not restricted to the coplanar structure, but the active layer 240 may have any kind of structure of a thin film transistor, for example at least one of selected from the group consisting of an inverted coplanar structure, a staggered structure, an inverted staggered structure, and the equivalent thereof; however, the structure of the active layer 240 is not restricted thereto.

The insulating layer 290 may be formed on the upper surface of the source/drain electrode 280. The insulating layer 290 covers the interlayer dielectric layer 270 which may circumscribe or cover the source/drain electrode 280. Further, the insulating layer 290 is also formed on the interlayer dielectric layer 270 corresponding to the alignment mark 230, 230*a*. The insulating layer 290 may include a protective layer 291 and a planarization layer 292 formed on the upper surface of the protective layer 291. The protective layer 291 covers the source/drain electrode 280 and interlayer dielectric layer 270, and protects the source/drain electrode 280 and the gate electrode 260. The protective layer 291 may be formed of any one selected from the typical inorganic film, and equivalents thereof; however, the protective layer 291 of the protective layer 291 is not limited thereto. The planarization layer 292 covers the protective layer 291. The planarization layer 292, which is making the entire surface of the element flat, may be formed with any one selected from BCB (benzocyclobutene), acryl, and equivalents thereof; however, the planarization layer 292 is not limited thereto.

The organic light emitting diode 300 may be formed on the upper surface of the insulating layer 290. The organic light emitting diode 300 may include an anode 310, an organic thin film 320 formed on the upper surface of the anode 310, and a cathode 330 formed on the upper surface of the organic thin film 320. The anode 310 may be formed of at least any one of the group consisting of ITO (Indium Tin Oxide), ITO (Indium Tin Oxide)/Ag, ITO (Indium Tin Oxide)/Ag/ITO (IZO: Indium Zinc Oxide), and equivalents; however, the material of the anode 310 is not limited thereto. The ITO is a transparent conductive film with a small hole injection barrier in relation to the organic thin film 320 due to a uniform work feature, and the Ag reflects the light from the organic thin film 320 to the upper surface in a top emission type display. The organic thin film 320 (also described as an organic light emitting thin film) may include an emission layer (EML) to emit light by forming excitons as the electron and hole contact to each other, an electron transport layer (ETL) to control the moving velocity of the electron appropriately, and a hole transport layer (HTL) to appropriately control the moving velocity of the hole. An electron injecting layer (EIL) may be formed on the electron transport layer, and a hole injecting layer (HIL) may further be formed on the hole transport layer. Further, the cathode 330 may be formed of at least any one selected from Al, MgAg alloy, MgCa alloy, and equivalents thereof; however, the material of the cathode 330 is not limited thereto. However, in the front emission type display, the Al should be very thin; however, the electron injection barrier is increased as the thickness of the Al is decreased due to increased resistance. The MgAg alloy has a lower electron injection barrier than that of the Al, and the MgCa alloy has a lower electron injection barrier than that of the MgAg alloy. However, as the MgAg alloy and the MgCa alloy are sensitive to external environmental factors and can be oxidized to form an insulating layer, a protective layer may be formed on the MgAg and MgCa alloys to shield the MgAg and the MgCa alloys from the environment. The anode 310 of the organic light emitting diode 300 may be electrically coupled with the source/drain electrode 280 by an electrically conductive contact 311, which is formed by perforating the insulating layer 290 (the protective layer 291, the planarization layer 292). Aspects of the present invention may be applied to a bottom-emitting type which emits toward the bottom of the substrate 210, and a dual surface-emitting type which emits light toward both surfaces of the substrate 210.

The pixel defining film 293 may be further formed on the insulating layer 290 which is an outer circumference of the organic light emitting diode 300. The pixel defining film 293 defines the boundaries between a red organic light emitting diode, a green organic light emitting diode, and a blue organic light emitting diode, and thus making the emitting boundary region between the pixels more clear. The pixel defining film 293 may be formed with at least any one selected from polyimide, and equivalents thereof; however, the material of the pixel defining film 293 is not limited thereto. The pixel defining film 293 may be formed on the insulating layer 290 corresponding to the alignment mark 230, 230*a*; however, the pixel defining film 293 can be omitted in some cases.

Figure 6:
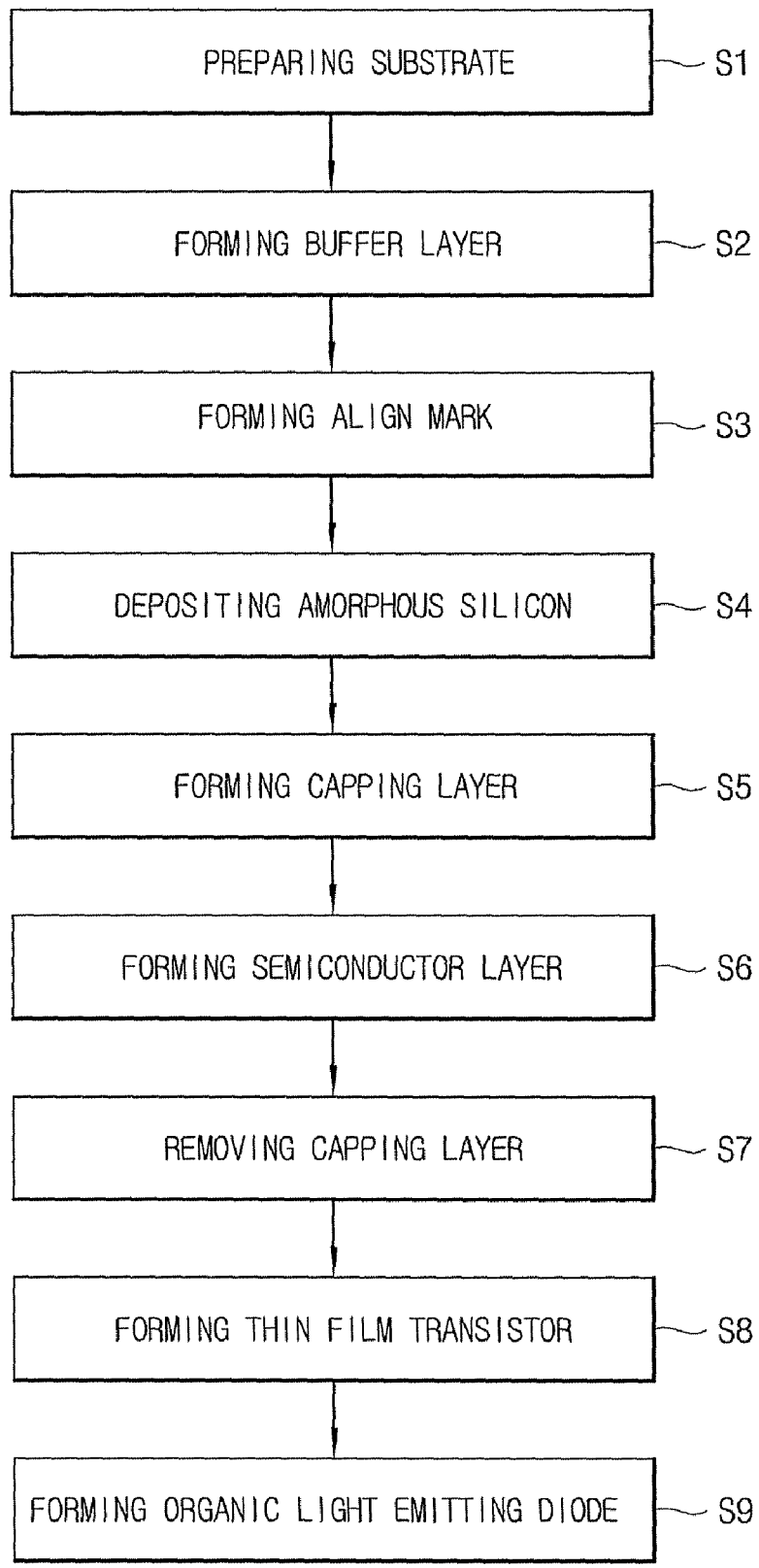
FIG. 6 is a flow chart illustrating the fabricating method of the organic light emitting display according to aspects of the present invention.

Referring FIG. 6, the fabricating method of the organic light emitting display according to aspects of the present invention is shown as a flow chart. As shown in FIG. 6, a fabricating method of the organic light emitting display according to aspects of the present invention includes operations of preparing a substrate (S1); forming a buffer layer (S2); forming an alignment mark (S3); depositing an amorphous silicon (S4); forming a capping layer (S5); forming an active layer (S6); removing the capping layer (S7); forming a thin film transistor (S8); and forming an organic light emitting diode (S9).

Figure 7A:
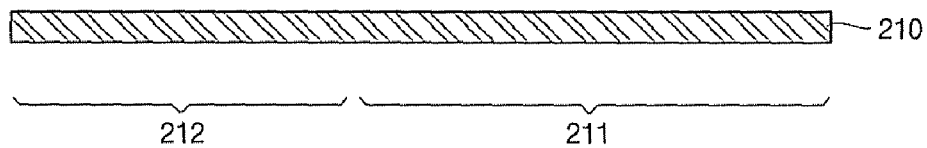
FIGS. 7a to 7i are cross-sectional views illustrating the fabricating method of the organic light emitting display according to aspects of the present invention.

Referring to FIGS. 7a to 7i, the fabricating method of the organic light emitting display according to aspects of the present invention is illustrated as a cross-sectional view. The fabricating method of the organic light emitting display having the alignment mark according to aspects of the present invention will be described with reference to FIGS. 6 and 7a to 7i. As shown in FIGS. 6 and 7a, the substrate 210, which is generally flat and has an upper surface and lower surface and with a uniform thickness is provided in the substrate preparing operation (S1). The substrate 210 may be any one selected from a glass, a plastic, a stainless steel, a nano complex composition, and equivalents thereof; however, the material or the substrate 210 is not limited thereto. It is preferable that the thickness of the substrate 210 is approximately 0.05 to 1 mm. When the thickness of the substrate 210 is approximately 0.05 mm and below, the substrate is vulnerable to damage by the cleaning, etching, and heat treatment processes and damage from external forces. When the thickness of the substrate 210 is approximately 1 mm and above, then it is hard to apply the substrate to the various slim displays. Here, the substrate 210 is classified into the display region 211 and the non-display region 212. As described above, the pixel region having a circuit (the active layer 240) and/or the organic light emitting diode 300 is formed in the display region 211, and the alignment mark 230 and the like may formed in the non-display region 212.

Figure 7B:
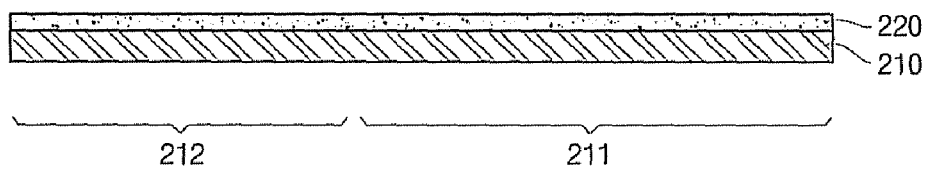

As shown in FIGS. 6 and 7b, the buffer layer 220 with a predetermined thickness is formed on the upper surface of the substrate 210 in the buffer layer forming operation (S2). That is, the buffer layer 220 is formed on the display region 211 and non-display region 212. The buffer layer 220 may be formed of at least any one selected from the group comprising silicon oxide film, silicon nitride film, inorganic film, and equivalents thereof; however, the buffer layer 220 is not limited thereto. The buffer layer 220 prevents $H_2O$, $H_2$, $O_2$ and the like from penetrating through the substrate 210 and deteriorating the alignment mark 230, the active layer 240, and the organic light emitting diode 300. The buffer layer 220 helps the alignment mark 230, the active layer 240, and the various layers to form on the surface thereof.

Figure 7C:
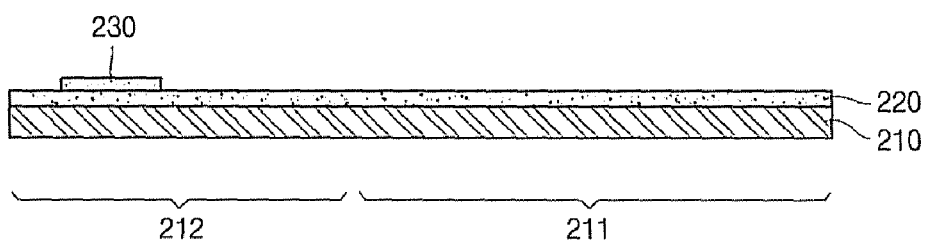

As shown in FIGS. 6 and 7c, the alignment mark 230, having a specific shape, is formed on the buffer layer 220 in the alignment mark forming operation (S3). Here, the alignment mark 230 is formed not on the display region 212 of the substrate 210, but on the non-display region 211. The alignment mark 230 is formed with any one selected from the group comprising a conductor, an insulator, an amorphous silicon, a microsilicon, a polysilicon, and equivalents thereof; however, the alignment mark 230 is not limited thereto. Here, the alignment mark 230 is formed on the buffer layer 220 (as shown in FIG. 5a); however, it is possible that the alignment mark 230 is formed underneath the buffer layer 220 (as shown in FIG. 5b). As such, the alignment mark 230 may be formed on the surface of the substrate 210, and then the buffer layer formed on the alignment mark 230. The alignment mark 230 may be formed on the surface of the substrate by a laser or a chemical etching method.

Figure 7D:
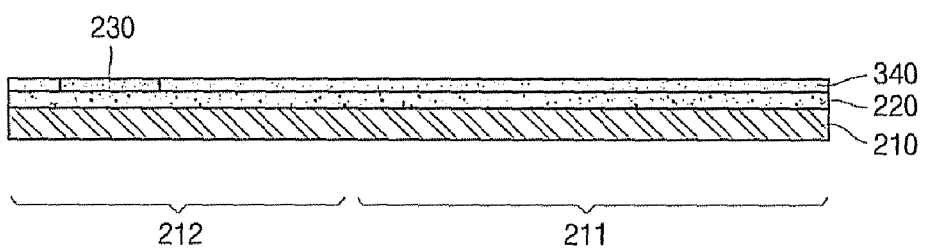

As shown in FIGS. 6 and 7d, the amorphous silicon 340 having a predetermined thickness is deposited on the upper surface of the buffer layer 220 in the amorphous silicon depositing operation (S4). That is, the amorphous silicon 340 is deposited on the display region 211 and the non-display region 212 of the substrate 210. For example, the amorphous silicon 340 may be formed by at least any one method selected from the group comprising PECVD (Plasma Enhanced Chemical Vapor Deposition), LPCVD (Low Pressure Chemical Vapor Deposition), sputtering, and equivalents thereof; however, the fabricating method of the amorphous silicon 340 is not limited thereto.

Figure 7E:
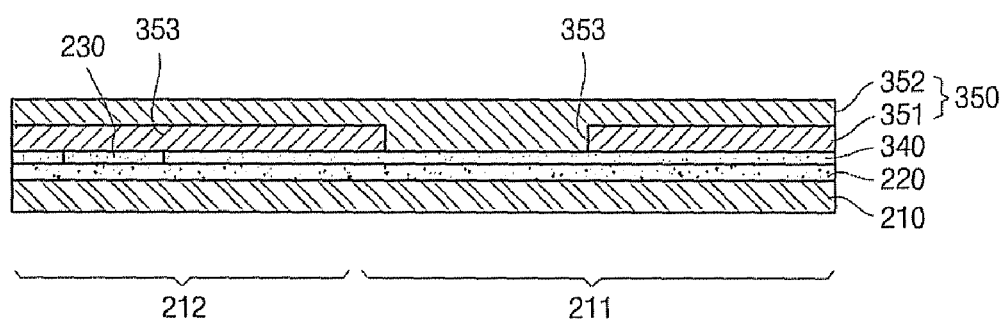

As shown in FIGS. 6 and 7e, the capping layer 350 comprising a diffusion preventing layer 351 and a diffusion layer 352 is formed on the upper surface of the amorphous silicon 340. For example, the diffusion preventing layer 351 having an opening 353, which has a specific size and a position, is formed on the upper surface of the buffer layer 220 in the display region 211. The opening 353 is spaced apart from the alignment mark 230 by a predetermined distance, and then the diffusion layer 352 is formed to cover the opening 353 and the diffusion preventing layer 351.

Here, the diffusion preventing layer 351 may be made of any one selected from a silicon oxide film, and equivalents thereof; however, the diffusion preventing layer 351 is not limited thereto. The diffusion layer 352 may be made of any one selected from a silicon nitride film, and equivalents thereof; however, the diffusion layer 352 is not limited thereto.

At least one the opening 353, which is formed in the diffusion preventing layer 351, is formed in a region corresponding to the display region 211 of the substrate 210. At this time, with reference to the align mark 240, the opening 353 may be accurately formed in the desired location. Therefore, the grain boundary of the polysilicon has a large size and a uniform directional property in the opening 353 formed on the display region 211. The size and position of the opening 353 formed on the display region 211 are designed according to the size and the position of the active layer 240, i.e., the thin film transistor.

Figure 7F:
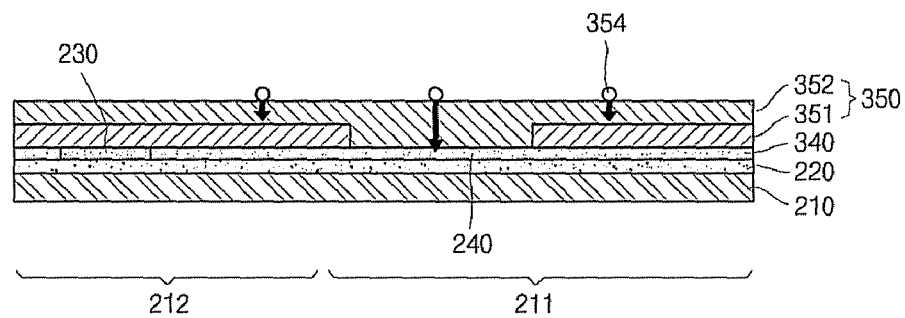

As shown in FIGS. 6 and 7f, the active layer 240 of the polysilicon is formed on the display region 211 of the substrate 210 in the active layer 240 forming operation (S6). Some other processes are to be executed in order to form the active layer 240; however, the polysilicon formed on the display region 211 is referred as an active layer 240.

Here, if the capping layer 350, i.e., in the state that the catalytic metal 354 is put on the diffusion layer 352, is heat-treated to a specific temperature, the polysilicon having a macro-grain boundary is formed as the catalytic metal 354 passes through the opening 353 of the capping layer 350 and a crystallization seed is formed.

The catalytic metal 354 applied to the capping layer 350 may be formed to have the volume density of approximate $1.0 \times 10^{18}$ to $1.0 \times 10^{22}$ atoms/cm$^3$. When the volume density of the catalytic metal 354 is approximately $1.0 \times 10^{18}$ atoms/cm$^3$ and below, then the crystallization according to the SGS crystallization method is not sufficiently achieved, and when the volume density of the catalytic metal 354 is approximately $1.0 \times 10^{22}$ atoms/cm$^3$ and above, then the leakage current is increased because of excessive catalytic metal 354 remains in the alignment mark 230, the active layer 240, and the buffer layer 220.

The catalytic metal 354 may be selected from the group comprising Ni, Pd, Ti, Ag, Au, Al, Sn, Sb, Cu, Co, Mo, Tr, Ru, Rh, Cd, Pt, and equivalents and combinations thereof; however, the material of the catalytic metal 354 is not limited thereto.

It is preferable that the heat treatment temperature is controlled to be 400 to 700° C. When the heat treatment temperature is 400° C. and below, then the crystallization by the catalytic metal 354 is not sufficiently achieved, and when the heat treatment temperature is 700° C. and above, then the substrate 210 may melt.

According to the processes, the catalytic metal 354 remains in the buffer layer 220, the alignment mark 230, and the active layer 240. The catalytic metal 354 is diffused throughout the active layer 240 as well as the buffer layer 220 and the alignment mark 230 by the heat treatment process. The catalytic metal 354 is controlled to have the volume density of approximately $2.0 \times 10^{18}$ atoms/cm$^3$ and below in order to minimize the leakage current.

When the alignment mark 230 is formed underneath the buffer layer 220, the volume density of the catalytic metal 354 has the value less than $2.0 \times 10^{18}$ atoms/cm$^3$. However, when the alignment mark 230 is formed on the buffer layer 220, the volume density of the catalytic metal 354 is almost identical as that of the catalytic metal 354 remaining in the active layer 240. For example, in the alignment mark 230 and the active layer 240 formed on the buffer layer 220, the volume density of the catalytic metal 354, which remains in the alignment mark 230 and the active layer 240, is controlled to be $1.0 \times 10^{16}$ to $1.0 \times 10^{20}$ atoms/cm$^3$.

It is possible to form the polysilicon having the desired grain boundary and the desired direction in the desired position as the position control opening 353 is formed in the desired position of the capping layer 350 by using the alignment mark 230. The thin film transistor with optimal specifications is manufactured as the thin film transistor is formed by the polysilicon. Further, such a crystallization method is referred to as a SGS crystallization method, as described above.

Figure 7G:
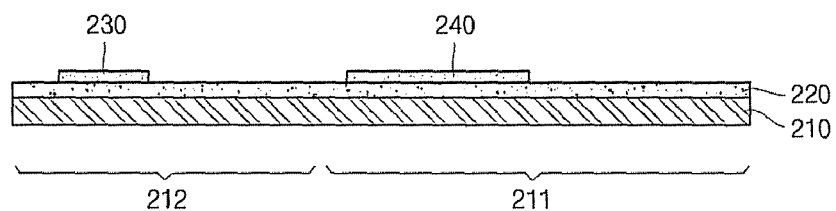

As shown in FIGS. 6 and 7g, the capping layer 350, which comprises of the diffusion preventing layer 351 and the diffusion layer 352, is removed from the amorphous silicon and the polysilicon by etching in the capping layer removing operation (S7).

A patterning operation may be effected after the capping layer removing operation (S7). That is, the amorphous silicon or the polysilicon (except the region to be used as an active layer 240) is removed from the non-display region 212 and display region 211 by etching. The position of the patterning of the active layer 240 is selected with reference to the alignment mark 230.

Figure 7H:
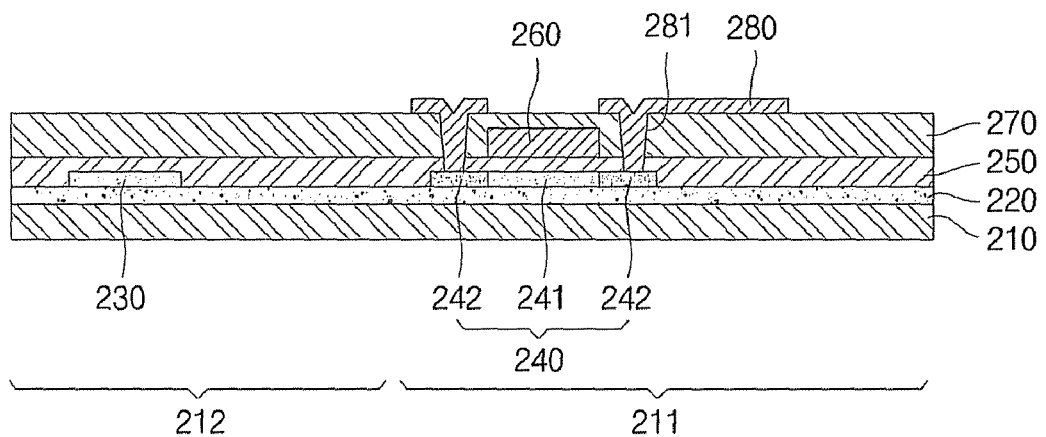

As shown in FIGS. 6 and 7g, the transistor is formed on the buffer layer 220 of the display region 211. More specifically, the active layer 240 is formed on the buffer layer 220. Then as shown in FIG. 7h, the gate insulating layer 250, having a specific thickness, is formed on the alignment mark 230 and the active layer 240. And, the gate electrode 260 is formed on the gate insulating layer 250 corresponding to the region to be used as a channel region of the active layer 240, and it is patterned. Likewise, the gate electrode 260 is formed by selecting the patterning position of the gate electrode 260 with respect to the alignment mark 230.

The source/drain regions 242 is formed by ion injecting a p-type impurity and an n-type impurity into the active layer 240, which are positioned at both sides of the gate electrode 260, and by activating them. And, the electrically conductive contact 281 is formed after the interlayer dielectric layer 270 is formed, and finally the source/drain electrode 280 is formed to be electrically coupled to the source/drain region 242 of the active layer 240, and the source/drain electrode 280 is patterned. In this process, the source/drain electrode 280 is formed by patterning the source/drain electrode 280 at a predetermined distance from the alignment mark 230.

Further, the insulating layer 290 is formed on the source/drain electrode 280 and the interlayer dielectric layer 270. As described above, the insulating layer 290 may comprise a protective layer 291 and a planarization layer 291. The protective layer 291 covers the source/drain electrode 280 and the interlayer dielectric layer 270. The protective layer 291 may be formed by depositing or coating a material selected from the typical inorganic film, and equivalents thereof. The planarization layer 292, which is to make the entire surface of the partially-constructed OLED flat, may be formed by depositing or coating a material selected from BCB (benzocyclobutene), acryl, and equivalents thereof.

The insulating layer 290 formed on the interlayer dielectric layer 270 and including the protective layer 291 and the planarization layer 292 may also be formed on the non-display region 212 corresponding to the alignment mark 230. The pixel defining film 293 may further be formed, and the pixel defining film 293 may also be formed on the non-display region 212 corresponding to the alignment mark 230. The pixel defining film 293 is formed by depositing or coating at least any one selected from polyimide, and equivalents thereof. The organic light emitting diode 300 is exposed by a photoresist, a coating, an exposure, a development, an etching, a photoresist peeling process, and the like.

Figure 7I:
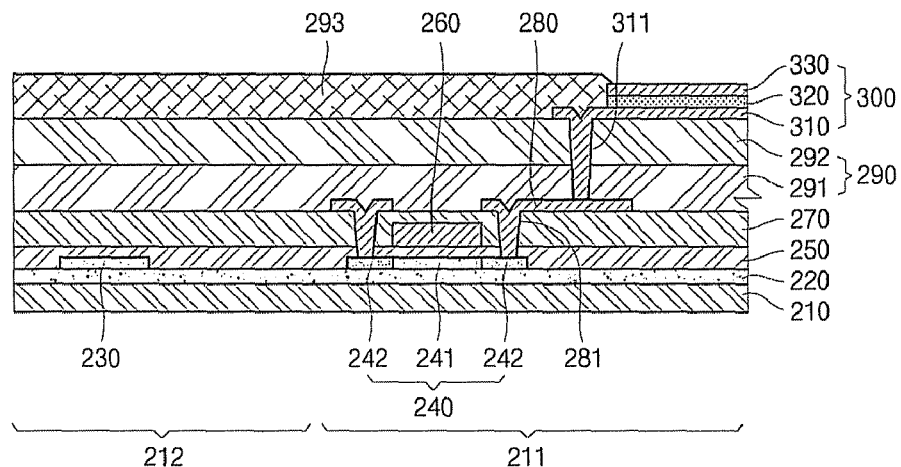

Finally, in the organic light emitting diode forming operation (S9), the anode 310, the organic thin film 320, and the cathode 330 are formed on the insulating layer 290 in sequence as shown in FIGS. 6 and 7i. The anode 310 may be formed with at least any one of the group comprising ITO (Indium Tin Oxide), ITO (Indium Tin Oxide)/Ag, ITO (Indium Tin Oxide)/Ag/ITO (IZO: Indium Zinc Oxide), and equivalents thereof; however, the material of the anode 310 is not limited thereto. For example, the anode 310 may be formed by at least any one method selected from RF sputtering, DC sputtering, ion-beam sputtering, and vacuum evaporation methods. After that, a desired size of the anode 310 is formed in the desired position by a photoresist, a coating, an exposure, a development, an etching, a photoresist peeling process, and the like. The anode 310 is electrically coupled to the source/drain electrode 280 through the electrically conductive contact 311, which extends through the insulating layer 210. Here, the ITO serves as a transparent conductive film with low hole injection barrier in relation to the organic light emitting thin film due to a uniform work feature, and Ag serves as a film to reflect the light from the organic thin film 320 to the upper surface in the top emission type display.

The organic thin film 320 may formed of a hole injecting layer (HIL) to improve the injection efficiency of the hole; a hole transport layer (HTL) to control the moving velocity of the hole appropriately; an emission layer (EML) to emit light by forming excitons as the electron and hole combine with each other; an electron transport layer (ETL) to control the moving velocity of the electron appropriately; and an electron injecting layer (EIL) to improve the injection efficiency of the electron in sequence; however, the organic thin film 320 is not limited thereto. For example, the organic thin film 320 may be formed by a wet coating method, such as a spin coating that applies the coating in the liquid state, a deep coating, a spray method, a screen printing method, an ink-jet printing method, and so on, or by a dry coating method, such as a sputtering, a vacuum evaporation, and so on.

The cathode 330 is formed on the upper surface of the electron injecting layer (EIL) in the organic thin film 320. The cathode 330 may be formed by depositing at least any one selected from Al, MgAg alloy, MgCa alloy, and equivalents thereof; however, the material or the manufacturing method of the cathode 330 is not limited thereto. For example, the cathode 330 may be formed by at least any one method selected from RF sputtering, DC sputtering, ion-beam sputtering, and vacuum evaporation method. After that, a desired size of the cathode 330 is formed in the desired position by a photoresist, a coating, an exposure, a development, an etching, a photoresist peeling method, and the like. Furthermore, when the front-emitting type display uses Al as the cathode 330, then the thickness should be very thin to increase a light emission rate. Thus, the electron injection barrier may be increased as the resistance is increased. Therefore, at least any one of the MgAg alloy, the MgCa alloy, or the equivalent thereof may be used as the cathode 330. The cathode 330 may be formed by one of ITO and IZO. Here, the MgAg alloy and the MgCa alloy are sensitive to external environment and form an insulating layer by oxidation, and seal the display.

Furthermore, in the phosphorescent organic light emitting diode, a hole blocking layer (HBL) may be selectively formed between the emission layer (EML) and the electron transport layer (ETL), and an electron blocking layer (EBL) may be selectively formed between the emission layer (EML) and the hole transport layer (HTL).

The organic thin film 320 may be formed as a thin organic light emitting diode, which reduces it's thickness by bonding two kinds of layers. For example, it is possible that a hole injection transport layer structure, which combines the hole injection layer (HIL) and the hole transport layer (HTL), or an electron injection transport layer structure which combines the electron injection layer (EIL) and the electron transport layer (ETL), may be formed selectively. The object of the slim organic light emitting diode is to increase the luminous efficiency.

An optional buffer layer may be formed between the anode and the emission layer. The optional buffer layer is classified into an electron buffer layer to buffer the electrons and a hole buffer layer to buffer the holes. The electron buffer layer may be formed between the cathode and the electron injection layer (EIL), and the electron buffer layer may be formed to replace the electron injection layer (EIL). The stack structure of the organic thin film 320 may be emission layer/electron transport layer/electron buffer layer/cathode. Also, the hole buffer layer may be selectively formed between the anode and the hole injection layer (HIL), and it may replace the feature of the hole injection layer (HIL). Here, the stack structure of the organic thin layer 320 may be anode/hole buffer layer/hole transport layer/emission layer.

The possible stack structures in relation to the above-mentioned structures are as follows:

a) Normal Stack Structure
1) anode/hole injection layer/hole transport layer/emission layer/electron transport layer/electron injection layer/cathode;
2) anode/hole buffer layer/hole injection layer/hole transport layer/emission layer/electron transport layer/electron injection layer/cathode;
3) anode/hole injection layer/hole transport layer/emission layer/electron transport layer/electron injection layer/electron buffer layer/cathode;
4) anode/hole buffer layer/hole injection layer/hole transport layer/emission layer/electron transport layer/electron injection layer/electron buffer layer/cathode;
5) anode/hole injection layer/hole buffer layer/hole transport layer/emission layer/electron transport layer/electron injection layer/cathode; or
6) anode/hole injection layer/hole transport layer/emission layer/electron transport layer/electron buffer layer/electron injection layer/cathode.

b) Normal Slim Structure
1) anode/hole injection transport layer/emission layer/electron transport layer/electron injection layer/cathode;
2) anode/hole buffer layer/hole injection transport layer/emission layer/electron transport layer/electron injection layer/cathode;
3) anode/hole injection layer/hole transport layer/emission layer/electron injection transport layer/electron buffer layer/cathode;
4) anode/hole buffer layer/hole transport layer/emission layer/electron injection transport layer/electron buffer layer/cathode;
5) anode/hole injection transport layer/hole buffer layer/emission layer/electron transport layer/electron injection layer/cathode; or
6) anode/hole injection layer/hole transport layer/emission layer/electron buffer layer/electron injection transport layer/cathode.

c) Inverted Stack Structure
1) cathode/electron injection layer/electron transport layer/emission layer/hole transport layer/hole injection layer/anode;
2) cathode/electron injection layer/electron transport layer/emission layer/hole transport layer/hole injection layer/hole buffer layer/anode;
3) cathode/electron buffer layer/electron injection layer/electron transport layer/emission layer/hole transport layer/hole injection layer/anode;
4) cathode/electron buffer layer/electron injection layer/electron transport layer/emission layer/hole transport layer/hole buffer layer/anode;
5) cathode/electron injection layer/electron transport layer/emission layer/hole transport layer/hole buffer layer/hole injection layer/anode; or
6) cathode/electron injection layer/electron buffer layer/electron transport layer/emission layer/hole transport layer/hole injection layer/anode.

d) Inverted Slim Structure
1) cathode/electron injection layer/electron transport layer/emission layer/hole injection transport layer/anode;
2) cathode/electron injection layer/electron transport layer/emission layer/hole injection transport layer/hole buffer layer/anode;
3) cathode/electron buffer layer/electron injection transport layer/emission layer/hole transport layer/hole injection layer/anode;
4) cathode/electron buffer layer/electron injection transport layer/emission layer/hole transport layer/hole buffer layer/anode;
5) cathode/electron injection layer/electron transport layer/emission layer/hole buffer layer/hole injection transport layer/anode; or
6) cathode/electron injection transport layer/electron buffer layer/emission layer/hole transport layer/hole injection layer/anode.

Furthermore, aspects of the present invention may be applied to a bottom-emitting type display, which emits light toward the bottom or lower side of the substrate 210, and a dual surface-emitting type, which emits light toward and away from the upper surface of the substrate 210.

Figure 8:
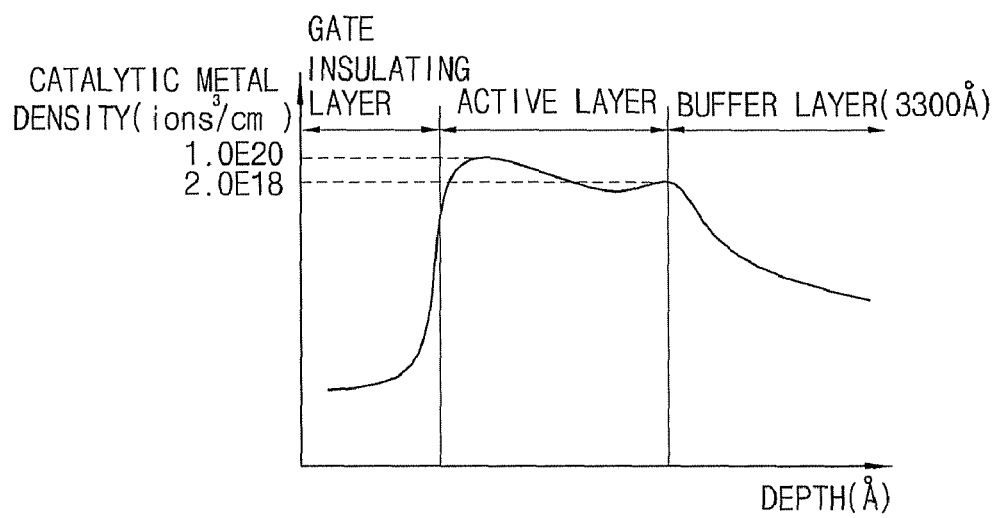
FIG. 8 is a graph illustrating a catalytic metal density profile of the gate insulating layer, the active layer and the buffer layer.

FIG. 8 is a graph illustrating a catalytic metal (354 from FIG. 7f) density profile of the gate insulating layer, the active layer, and the buffer layer in the organic light emitting display. As shown in the graph, the catalytic metal remains in the buffer layer as well as the active layer, since the amorphous silicon is crystallized into the polysilicon by use of the catalytic metal. The density of the catalytic metal is not high enough to cause the leakage current to flow. The density of the catalytic metal is relatively high in the active layer, and the density of the catalytic metal is relatively low in the buffer layer. The density of the catalytic metal becomes low as the depth within the buffer layer increases (i.e., the density of the catalytic metal decreases closer to the substrate).

When the alignment mark is formed on the buffer layer, the density of the catalytic metal which remains in the alignment mark and the active layer is almost identical. Indeed, when the alignment mark is formed on the buffer layer, the volume density of the catalytic metal which remains in the alignment mark and the active layer is approximately $1.0\times10^{16}$ to $1.0\times0^{20}$ atoms/cm$^3$. When the volume density of the catalytic metal is $1.0\times10^{20}$ atoms/cm$^3$ and above, the leakage current may be generated, and thus it is not preferable.

Furthermore, the density of the catalytic metal of the active layer decreases slightly closer to the substrate as shown in FIG. 8. However, the density of the catalytic metal is slightly increased at the boundary between the active layer and the buffer layer. The catalytic metal also remains in the buffer layer as described above, it is preferable that the volume density of the catalytic metal is controlled to be $2.0\times10^{18}$ atoms/cm$^3$ and below. That is, when volume density of the catalytic metal is $2.0\times10^{18}$ atoms/cm$^3$ and above, then the leakage current may flow and thus it is not preferable. If the depth of the buffer layer is infinite, the volume density of the catalytic metal is almost 0; however, there is no detecting device capable of detecting such volume density.

The characteristic of the thin film transistor in which the position control is not achieved, and the characteristic of the thin film transistor in which the position control is achieved according to aspects of the present invention are described in the Table 1.

TABLE 1

|  | Vth [V] | | S-factor [V/dev]] | | off current [A/µm] | |
| --- | --- | --- | --- | --- | --- | --- |
|  | AVG | STD | AVG | STD | AVG | STD |
| present invention | 3 | 0.05 | 0.44 | 0.01 | 1.20E−12 | 4.10E−13 |
| conventional art | 2.9 | 0.1 | 0.48 | 0.03 | 6.30E−12 | 1.10E−11 |

As described in the Table 1, the average threshold voltage (Vth) was 2.9V with a standard deviation of the threshold voltage (Vth) of 0.1V in the thin film transistor according to the conventional invention; however, the average threshold voltage (Vth) was 3V with a standard deviation of the threshold voltage (Vth) of 0.05V in the thin film transistor according to aspects of the present invention, and thus it is improved.

The average S-factor was 0.48V/dev with a standard deviation of the S-factor of 0.03V/dev in the thin film transistor according to the conventional invention; however, the average S-factor was 0.44V/dev with a standard deviation of the S-factor of 0.01V/dev in the thin film transistor according to aspects of the present invention, and thus it is improved.

Finally, the average off current was $6.30\times10^{12}$ A/µm with a standard deviation of the off current of $1.10\times10^{-11}$ A/µm in the thin film transistor according to the conventional invention; however, the average of the off current was $1.20\times10^{-12}$ A/µm with a standard deviation of the off current of $4.10\times10^{-13}$ A/µm in the thin film transistor according to aspects of the present invention, and thus it is improved.

The organic light emitting display and the fabricating method thereof may form the polysilicon or the active layer (thin film transistor) with an optimal position by forming the alignment mark on the non-display region of the substrate. That is, the characteristic dispersion between the diodes may be considerably improved by forming the polysilicon having a grain boundary of optimal size, direction, and position by using the alignment mark and by forming the active layer (thin film transistor) at an optimal position at a predetermined distance from the alignment mark.

For example, the thin film transistor formed by the above-mentioned method had an average S-factor of 0.44V/dev with a standard deviation of 0.01V/dev. Also, the thin film transistor had an average off current of $1.20\times10^{-12}$ A/µm with a standard deviation of $4.10\times10^{-13}$ A/µm.

Furthermore, the organic light emitting diodes, which are electrically coupled to the thin film transistor formed by the above mentioned method, have a uniform luminance, even as the size of the panel is increased.

Although a few embodiments and aspects of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting display comprising:
a substrate having a display region and a non-display region;
a buffer layer formed on the display region and the non-display region in which a catalytic metal is present;
an alignment mark formed on one of the buffer layer and the substrate in the non-display region of the substrate;
an active layer formed by an SGS crystallization method on the buffer layer corresponding to the display region of the substrate;
a gate insulating layer formed on the alignment mark and the active layer;
a gate electrode formed on the gate insulating layer corresponding to the active layer;
an interlayer dielectric layer formed on the gate insulating layer;
a source/drain electrode formed on the interlayer dielectric layer and electrically coupled to the active layer;
an insulating layer formed on the source/drain electrode; and
an organic light emitting diode formed on the insulating layer and electrically coupled to the source/drain electrode,
wherein the active layer is formed at a predetermined distance from the alignment mark,
wherein the catalytic metal is present in the alignment mark and the active layer, and
wherein the volume density of the catalytic metal present in the alignment mark and the active layer is $1.0\times10^{16}$ to $1.0\times10^{20}$ atoms/cm$^3$.

2. The organic light emitting display according to claim 1, wherein the volume density of the catalytic metal present in the buffer layer is less than $2.0\times10^{18}$ atoms/cm$^3$.

3. The organic light emitting display according to claim 1, wherein the catalytic metal is selected from the group comprising Ni, Pd, Ti, Ag, Au, Al, Sn, Sb, Cu, Co, Mo, Tr, Ru, Rh, Cd, Pt, and combinations thereof.

4. The organic light emitting display according to claim 1, wherein the active layer is polysilicon formed by the SGS crystallization method having no grain boundary or at least one grain boundary.

5. The organic light emitting display according to claim 1, wherein the alignment mark is formed on the buffer layer.

6. The organic light emitting display according to claim 1, wherein the alignment mark is formed on the substrate.

7. The organic light emitting display according to claim 1, wherein the alignment mark is formed of a material selected from the group consisting of conductor, insulator, amorphous silicon, microsilicon, and polysilicon.

8. The organic light emitting display according to claim 1, wherein the thickness of the alignment mark is 100 to 1000 Å.

9. The organic light emitting display according to claim 1, wherein the shape of the alignment mark is one of a triangle shape, a square shape, a rhombus shape, a pentagon shape, a cross shape, and a "—" shape, and combinations thereof.

10. The organic light emitting display according to claim 1, wherein the cross-sectional area of the alignment mark is 100 to 900 µm².

11. The organic light emitting display according to claim 1, wherein the width of the alignment mark is 1 to 20 µm.

12. The organic light emitting display according to claim 1, wherein the active layer, the gate insulating layer, the gate electrode, the interlayer dielectric layer, and the source/drain electrode form a thin film transistor having an average of S-factor of 0.44V/dev with a standard deviation of 0.01V/dev.

13. The organic light emitting display according to claim 1, wherein the active layer, the gate insulating layer, the gate electrode, the interlayer dielectric layer, and the source/drain electrode form a thin film transistor having an average off current of $1.20 \times 10^{-12}$ A/µm with a standard deviation of $4.10 \times 10^{-13}$ A/µm.

14. The organic light emitting display according to claim 1, wherein the display region is formed at a center of the substrate, and the non-display region is formed about a periphery of the display region.

15. The organic light emitting display according to claim 1, wherein the substrate is formed of a material selected from a glass, a plastic, a stainless steel, and a nanocomposite material.

16. The organic light emitting display according to claim 1, wherein the interlayer dielectric layer is formed on the gate insulating layer corresponding to the alignment mark.

17. The organic light emitting display according to claim 16, wherein the insulating layer is further formed on the interlayer dielectric layer corresponding to the alignment mark.

18. The organic light emitting display according to claim 1, wherein the insulating layer comprises a protective layer and a planarization layer, and the insulating layer is formed on the region corresponding to the alignment mark.

19. A fabricating method of an organic light emitting display comprising:
    preparing a substrate having a non-display region formed about a periphery of a display region;
    forming a buffer layer on the display and non-display regions;
    forming an alignment mark on the non-display region;
    depositing an amorphous silicon on the buffer layer;
    forming a capping layer on the amorphous silicon;
    crystallizing the amorphous silicon to form a polysilicon by diffusing a catalytic metal throughout the amorphous silicon and activating the catalytic metal and performing heat treatment to form an active layer; and
    forming an organic light emitting diode electrically coupled to the active layer,
    wherein the active layer is formed at a predetermined distance from the alignment mark,
    wherein the catalytic metal used in the polysilicon forming operation remains in at least one of the alignment mark and the buffer layer,
    wherein the catalytic metal is present in the alignment mark and the active layer, and
    wherein the volume density of the catalytic metal present in the alignment mark and the active layer is $1.0 \times 10^{16}$ to $1.0 \times 10^{20}$ atoms/cm³.

20. The fabricating method of claim 19, wherein the forming of the capping layer comprises:
    forming a diffusion preventing layer having at least one opening for position control at a distance from the alignment mark; and
    forming a diffusion layer that covers the opening for position control and the diffusion preventing layer.

21. The fabricating method of claim 19, wherein the active layer is spaced apart at a predetermined direction from the alignment mark.

22. The fabricating method of claim 19, wherein the catalytic metal used in the polysilicon forming operation is one selected from the group comprising Ni, Pd, Ti, Ag, Au, Al, Sn, Sb, Cu, Co, Mo, Tr, Ru, Rh, Cd, Pt, and combinations thereof.

23. The fabricating method of claim 19, wherein a portion of the catalytic metal remains in the buffer layer.

24. The fabricating method of claim 23, wherein the volume density of the portion of the catalytic metal that remains in the buffer layer is less than $2.0 \times 10^{18}$ atoms/cm³.

25. The fabricating method of claim 19, wherein the performing the heat treatment comprises heating the substrate, the buffer layer, the amorphous silicon, the capping layer, and the catalytic metal to 400 to 700° C.

26. The fabricating method of claim 19, further comprising removing the amorphous silicon that was not crystallized after the forming the active layer.

27. The fabricating method of claim 19, wherein the alignment mark is formed on the buffer layer.

28. The fabricating method of claim 19, wherein the alignment mark is formed on the surface of the substrate and the buffer layer covers the alignment mark.

29. The fabricating method of claim 19, wherein the alignment mark is formed of one selected from the group consisting of a conductor, an insulator, an amorphous silicon, a microsilicon, and a polysilicon.

30. The fabricating method of claim 19, wherein the thickness of the alignment mark is 100 to 1000 Å.

31. The fabricating method of claim 19, wherein the shape of the alignment mark is one of a triangle shape, a square shape, a rhombus shape, a pentagon shape, a cross shape, a "—" shape, and combinations thereof.

32. The fabricating method of claim 19, wherein the cross-sectional area of the alignment mark is 100 to 900 µm².

33. The fabricating method of claim 19, wherein the width of the alignment mark is 1 to 20 µm.

34. The fabricating method of claim 20, wherein the opening for position control is formed in the desired position of the diffusion preventing layer by using the alignment mark.

* * * * *